United States Patent
Underhill

(10) Patent No.: US 6,791,393 B1
(45) Date of Patent: Sep. 14, 2004

(54) ANTI-JITTER CIRCUITS

(75) Inventor: Michael James Underhill, Lingfield (GB)

(73) Assignee: Toric Limited, London (GB)

( * ) Notice: Subject to any disclaimer, the term of this patent is extended or adjusted under 35 U.S.C. 154(b) by 0 days.

(21) Appl. No.: 09/831,413

(22) PCT Filed: Nov. 12, 1999

(86) PCT No.: PCT/GB99/03776

§ 371 (c)(1),
(2), (4) Date: Aug. 1, 2001

(87) PCT Pub. No.: WO00/30256

PCT Pub. Date: May 25, 2000

(30) Foreign Application Priority Data

Nov. 13, 1998 (GB) .............................. 9824989
Apr. 1, 1999 (GB) .............................. 9907733

(51) Int. Cl.[7] .............................................. H03K 17/16
(52) U.S. Cl. ....................... 327/379; 327/165; 327/551; 326/26
(58) Field of Search ................................ 327/379–381, 327/387, 389–391, 551–553, 558, 175, 172, 309–313, 323, 165; 326/26, 27

(56) References Cited

U.S. PATENT DOCUMENTS

| 3,800,167 A | * | 3/1974 | Smith | 327/184 |
| 3,883,756 A | * | 5/1975 | Dragon | 327/131 |
| 4,071,781 A | | 1/1978 | Kayalioglu | 327/165 |
| 4,142,110 A | | 2/1979 | Weber | 327/307 |
| 4,226,219 A | * | 10/1980 | Olmstead | 123/406.53 |
| 5,438,289 A | | 8/1995 | Kan et al. | 327/97 |

FOREIGN PATENT DOCUMENTS

| EP | 0 383 271 A2 | 8/1990 |
| EP | 0 592 048 A2 | 4/1994 |
| EP | 0 681 364 | 11/1995 |
| JP | 57207419 | 12/1982 |
| WO | WO 97/30516 A1 | 8/1997 |

OTHER PUBLICATIONS

Kraus, "Fast DC–coupled trigger," *Elec. World and Wireless World, 96,* 1651, p. 7 (1990).
Weiss, Richard, Time and Standard Frequency Receiver For DCF 77 With Back–Up Operation., *Funkschau,* edition 22 pgs. 964–968, 1976.

* cited by examiner

Primary Examiner—Minh Nguyen
(74) Attorney, Agent, or Firm—Leydig, Voit & Mayer, Ltd.

(57) ABSTRACT

An anti-jitter circuit has an integrator storage capacitor. A charge pump derives from an input pulse train at least one charge packet during each cycle of the input pulse train and supplies the charge packets to the storage capacitor. A controlled current sink operating in conjunction with a high impedance low pass filter continuously discharges the storage capacitor to create a sawtooth voltage waveform having a mean d.c. voltage level. A differential comparator compares the sawtooth voltage waveform with the mean d.c. voltage level and the comparator output is used to trigger a monostable circuit to generate an output pulse train having reduced time jitter

28 Claims, 12 Drawing Sheets

ANTI-JITTER CIRCUITS

BACKGROUND OF THE INVENTION

An AJC is described in our European patent application No. 97903456.8 based on International patent application, publication No. WO 97/305 16. The described AJC circuit provides a unique way of reducing phase noise or time jitter on a frequency source, typically 20 dB or more for the or each (fully cascaded) stage. FIGS. 1(a) to 1(c) of the accompanying drawings illustrate the principle of operation of this earlier AJC. FIG. 1(a) is a block circuit diagram of the system described in the earlier patent application, FIG. 1(b) shows an input pulse train with jitter (shown in broken outline) on the central pulse and FIG. 1(c) shows the corresponding integrator output (Op2) and the comparator switching level (Op3).

The present invention provides an improvement over this earlier AJC. Because the implementation of the core part of the improved AJC requires no d.c. power the term adiabatic anti-jitter circuit (AAJC) will be used hereinafter.

SUMMARY OF THE INVENTION

According to the invention there is provided an anti-jitter circuit for reducing time jitter in an input pulse train comprising:
an integrator charge storage means,
charging means for deriving from the input pulse train at least one charge packet during each cycle of the input pulse train and for supplying the charge packets to the integrator charge storage means, and
discharging means for continuously discharging the integrator charge storage means,
the charging means and the discharging means being operative to create on the integrator charge storage means a time varying voltage waveform having a mean d.c. voltage level, and
means for comparing said time varying voltage waveform with said mean d.c. voltage level and deriving an output pulse train as a result of the comparison.

DESCRIPTION OF THE DRAWINGS

Anti-jitter circuits according to the invention are now described, by way of example only, with reference to the accompanying drawings in which:

FIG. 2(a) is a circuit diagram of the anti-jitter circuit. FIG. 2(b) shows an input waveform Op1, a sawtooth waveform Op2 and a mean d.c. level Op3. FIG. 2(c) shows the waveforms Op2 and Op3 superposed and FIG. 2(d) shows a detail of the superposed waveforms, FIGS. 3(a), 3(b); 4(a), 4(b) and 5(a), 5(b) illustrate further embodiments of the anti-jitter circuit shown in FIGS. 2(a) to 2(d).

FIG. 7(a) is a circuit diagram of the anti-jitter circuit. FIG. 7(b) shows the sawtooth waveform Op2 and the mean d.c. level Op3 overlaid and FIG. 7(c) shows an expanded detail of the overlaid waveforms.

FIGS. 8(a) and 9(a) are circuit diagrams showing the anti-jitter circuits. FIGS. 8(b) and 8(c) also show a voltage waveform Op4.

DESCRIPTION OF PREFERRED EMBODIMENTS

Figure 1A:
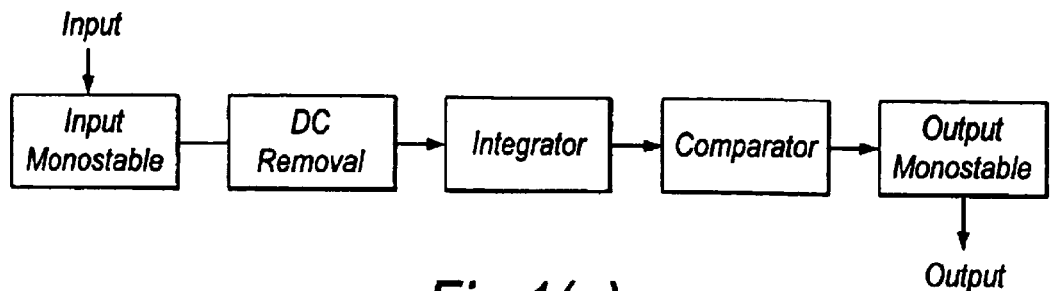
FIGS. 1(a) to 1(c) illustrate a known anti-jitter circuit described in our International patent application, publication number WO 97/30516.
Figure 1B:
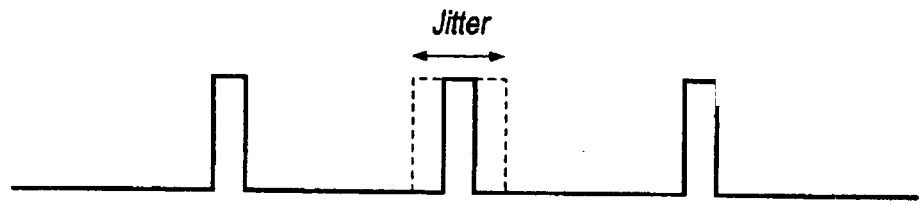
Figure 1C:
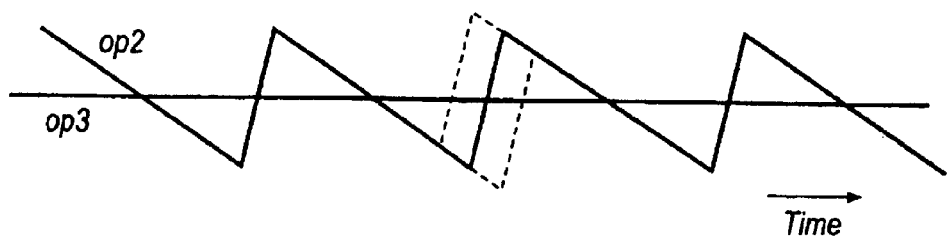

The principle of operation can be seen by reference to FIGS. 2a to 2d, and it has some similarities to that of a charge pump. An approximately constant charge packet is formed either once or, in a second variation of the scheme, twice per input frequency source cycle. Each charge packet adds to the charge in an integrator storage capacitor C3. A controlled current source T1 (or more accurately current sink) discharges the capacitor C3 at a rate that maintains a substantially constant mean dc voltage level on the integrator storage capacitor C3. A high impedance low pass filter (R1, C4) connected to the integrator storage capacitor C3 establishes the mean d.c. voltage level that then controls the discharge current in a negative feedback configuration. The combination of intermittent charging and continuous discharging creates a sawtooth voltage waveform Op2 on the integrator storage capacitor C3. The two (high impedance) inputs of a differential comparator (not shown) are connected respectively to the input and output of the low pass filter. This establishes switching points when the mean dc level Op3 is equal to the sawtooth voltage waveform Op2 present on the integrator storage capacitor C3. The switching point on the discharge part of the sawtooth waveform has very much reduced timing jitter (as described in the aforementioned publication). This discharge switching transition then triggers an output monostable or divide-by-two circuit, as described in that publication.

The combination of the negative feedback and the differential comparator means that the correct comparator switching levels are established automatically for a very wide range of input frequencies without any change of circuit components values.

When the (optional) diodes D5 to D8 in FIG. 2 are not conducting, the time constant R1C3C4/(C3+C4) determines the sideband frequency below which the jitter suppression starts to degrade at a 6 dB per octave rate. The optimum loop gain is found to be $gmR1=(C3+C4)^2/C3C4$. For a FET we have $gm=\sqrt{(2I_{dis}\beta)}$ and from the explanation below it can be seen that $I_{dis}=f_{in_a}Q$, that is proportional to input frequency. The consequence is that the loop gain varies as the square root of input frequency. For such a control loop the loop gain can typically be allowed to vary by up to four to one with little variation in overall settling time or loop bandwidth. This then corresponds to a working frequency range of sixteen to one with no changes in component values.

The four optional "speed up" diodes D5 to D8 shown across the resistor R1 provide a low impedance path from input to the output shunt capacitor C4 of the low pass filter if the positive or negative voltage exceeds 2 diode (Vbe) offset levels (approximately 2×0.6 volts typically). This option lowers the time constant of the low pass filter by orders of magnitude during initial acquisition of lock of output signal to input signal, or if large frequency or phase jump deviations occur in the input signal. The time for initial acquisition is thus much reduced and input to output lock is maintained (with no input pulses missed) over a wider range of input deviations of phase or frequency. The presence of the diodes also allows phase jitter sideband components much closer to carrier to be better suppressed after a full settling has occurred.

Figure 2A:
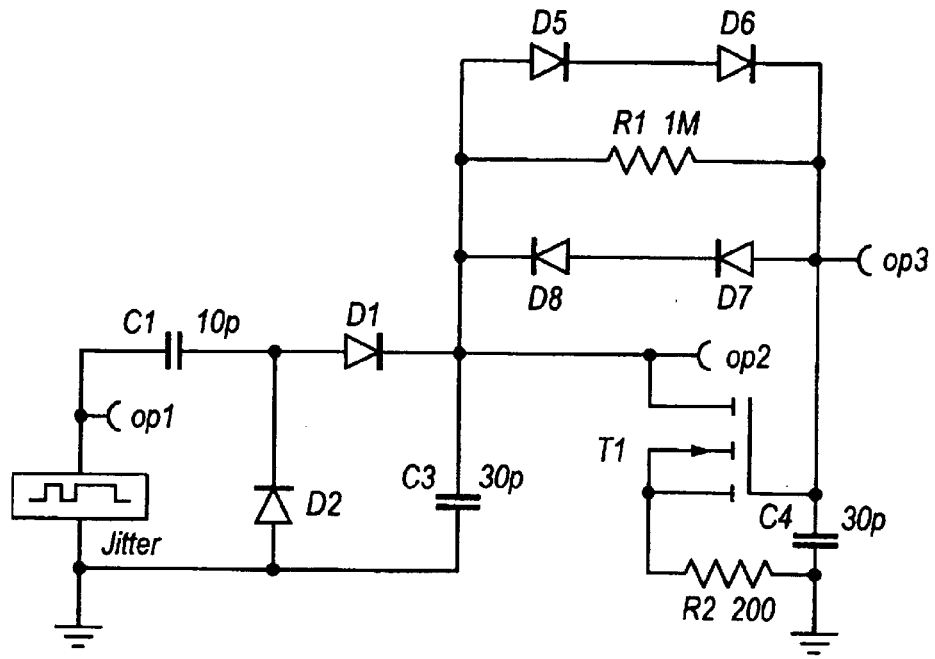
FIGS. 2(a) to 2(d) illustrate an embodiment of an anti-jitter circuit according to the present invention.
Figure 2B:
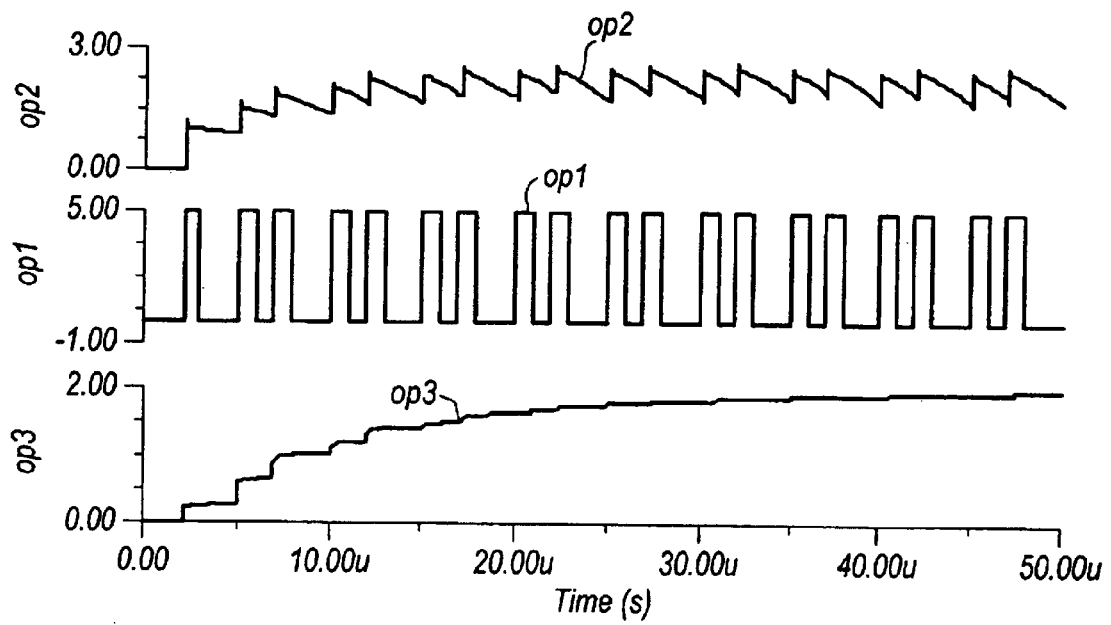
Figure 2C:
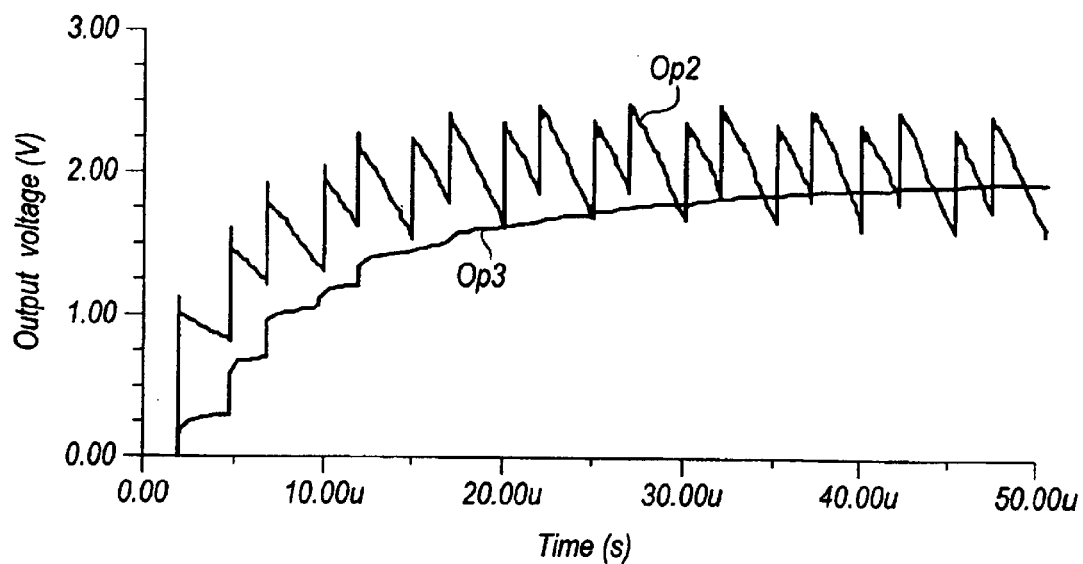
Figure 2D:
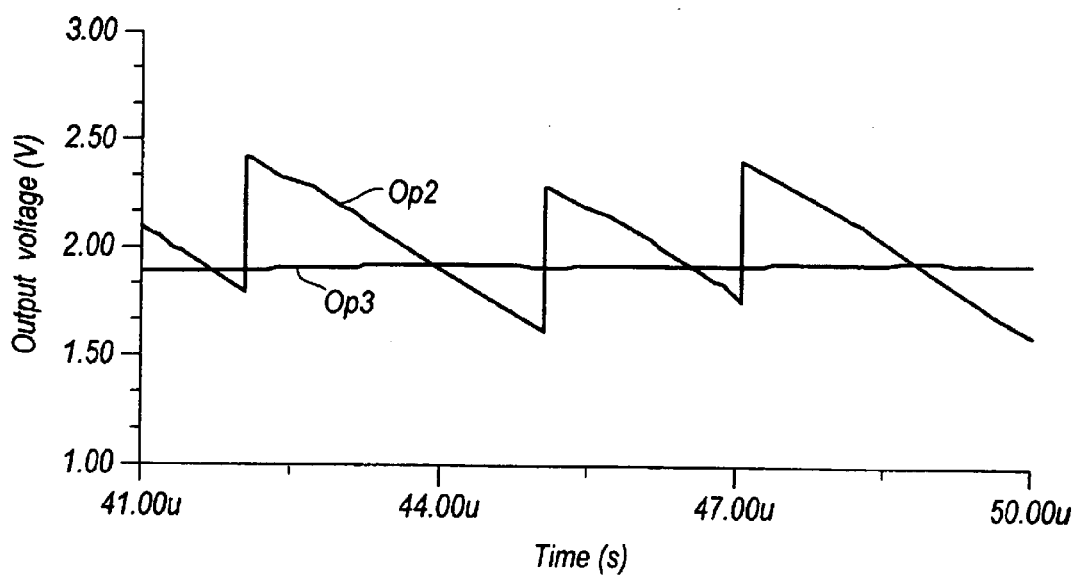

In the case of the charge pump arrangement of diodes D1 and D2, and input capacitor C1 in FIG. 2(a), the peak-to-peak amplitude $V_{ppst}$ of the sawtooth waveform is given approximately by the relationship $Q=C_3 \, V_{ppst}=C_1 \, V_{ppin}$, where $V_{ppin}$ is the peak-to-peak input voltage and $C_3$ is the integrator storage capacitance. Q is actually the quantity of charge being transferred from C1 to C3 each time a transfer occurs. A large phase jitter adds substantially to the peak-to-peak voltage swing whilst two diode offsets should be subtracted from $V_{ppin}$ to obtain a more accurate relationship. This relationship is used to ensure that the worst case $V_{ppst}$ for the sawtooth is sufficiently less than 4 (Vbe) diode offsets range between the switch on levels of the speed up diodes D5 to D8.

Conveniently, controlled current source T1 is a transistor in the form of an insulated gate FET (as shown in FIG. 2(a)). Alternatively a high input impedance bipolar transistor combination such as a Darlington arrangement may be used in place of T1. A high input impedance is desirable so that a long time constant (or low cut off frequency) can be obtained for the low pass filter and at the same time keeping the value of the filter capacitor C4 to a low value. For fastest speed up acquisition time, C4 is made comparable in value to charge pump and storage capacitors C1 and C3.

The mean diode discharge current $I_{dis}$ is given by the relationship $I_{dis}=f_{ina} \, Q$ where the charge packet Q has been defined in the above and $f_{ina}$ is the rate of input frequency active transitions. Thus the FET or transistor characteristics should be chosen to provide this current at the desired mean sawtooth voltage. The value of the resistor R2 can also be conveniently chosen to reach this desired design objective; particularly there is a constraint on the choice of transistor characteristics. For a given transistor choice the resistor R2 can also be conveniently chosen to give a typical 10 to 1 operating frequency range anywhere within a design envelope of typically 1000 to 1, without having to alter the value of any other component within the circuit.

Figure 3A:
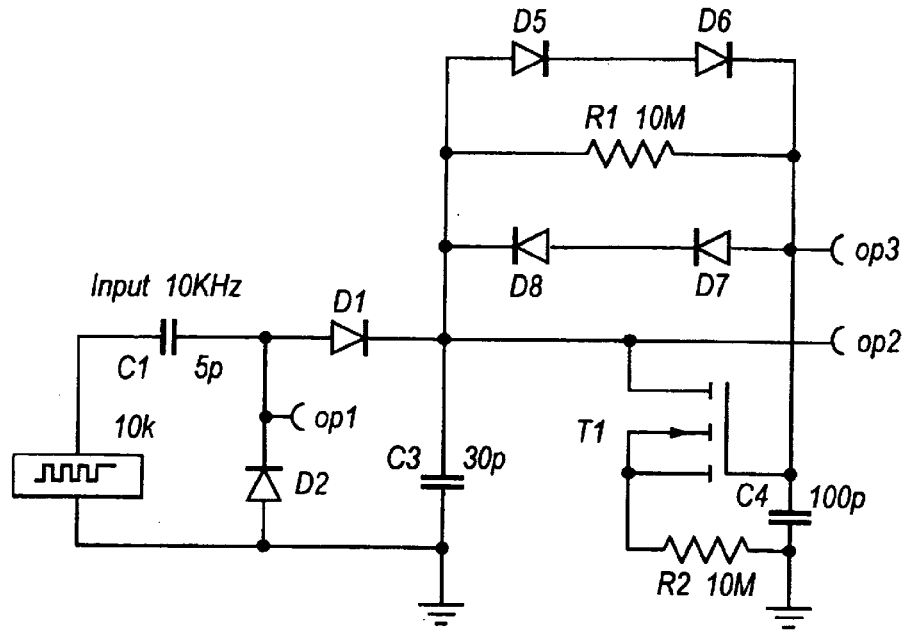
FIGS. 3(a), 4(a) and 5(a) are circuit diagrams showing the anti-jitter circuits
Figure 3B:
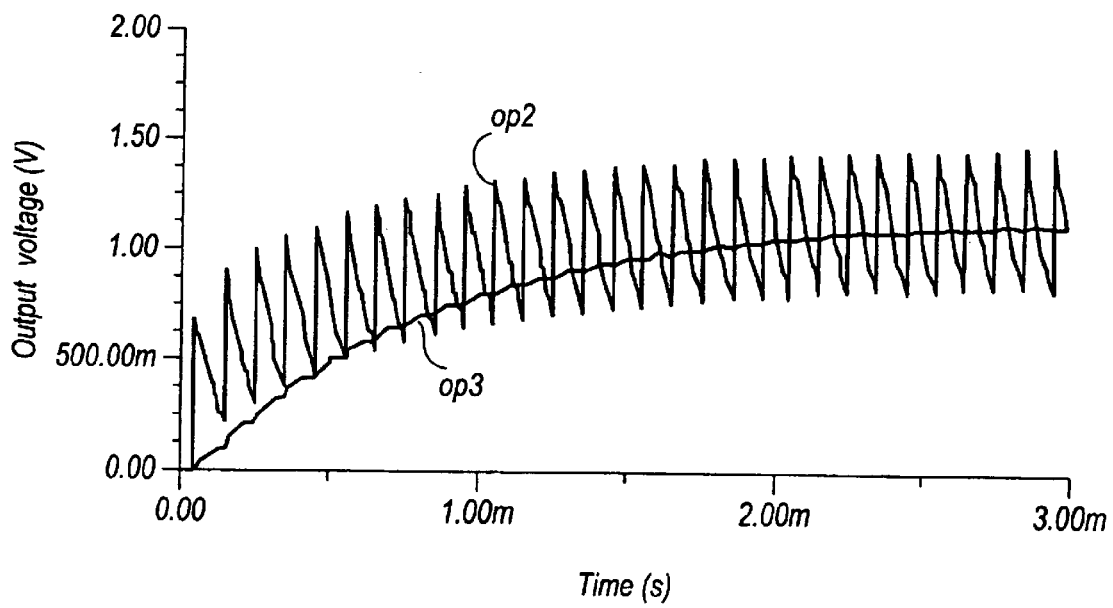
FIGS. 3(b), 4(b) and 5(b) show the respective sawtooth waveforms Op2 and the mean d.c. levels Op3 overlaid.
Figure 4A:
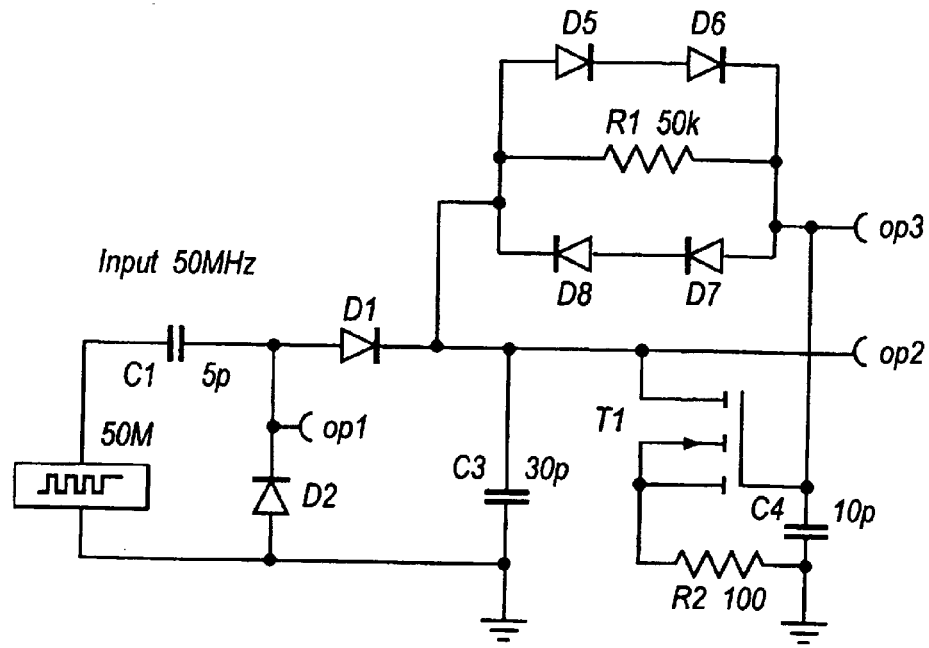
Figure 4B:
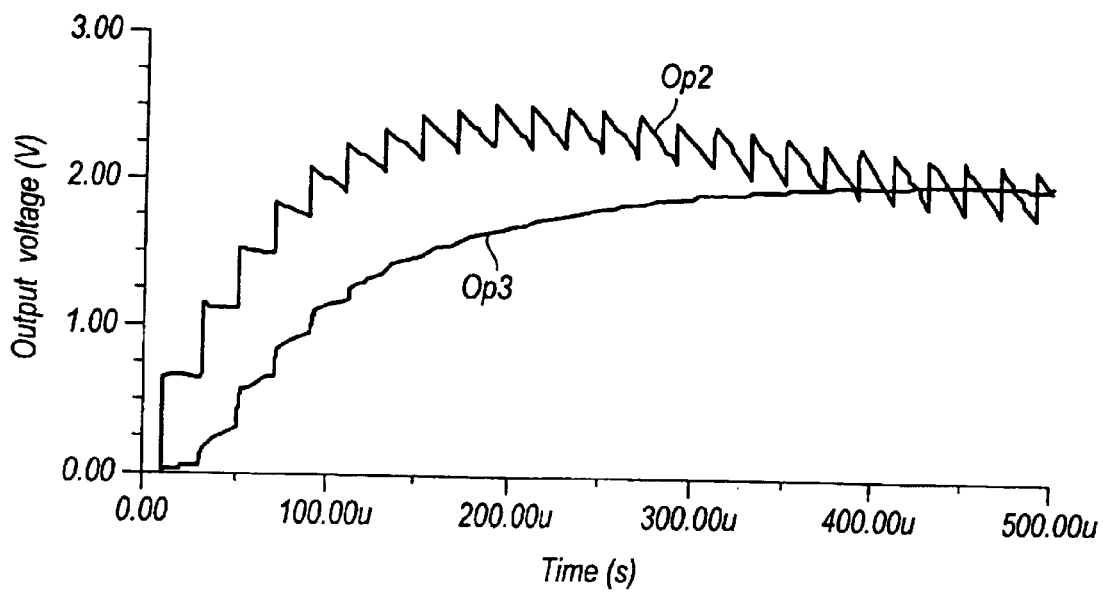
Figure 5A:
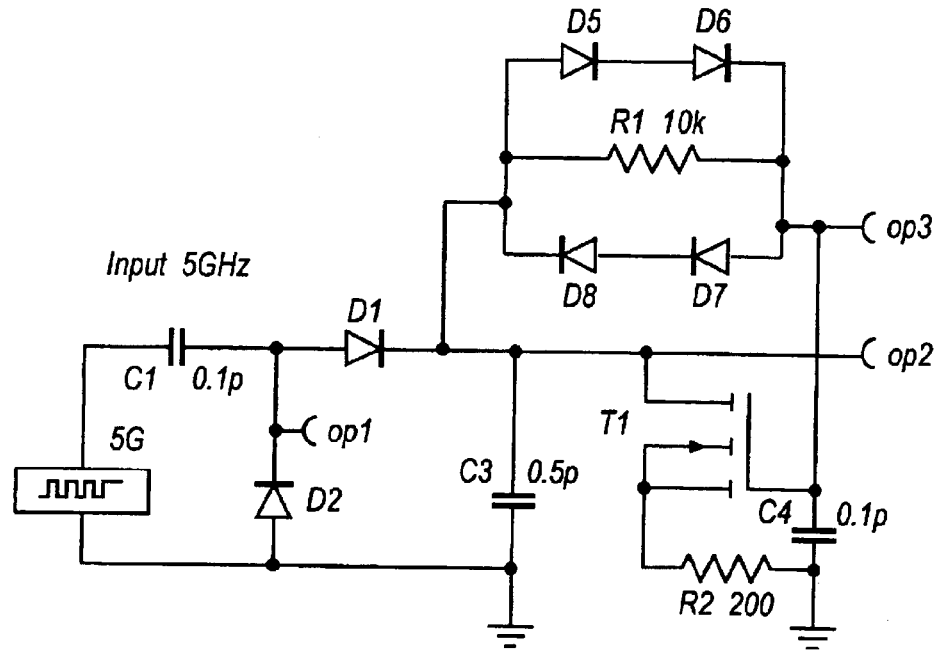
Figure 5B:
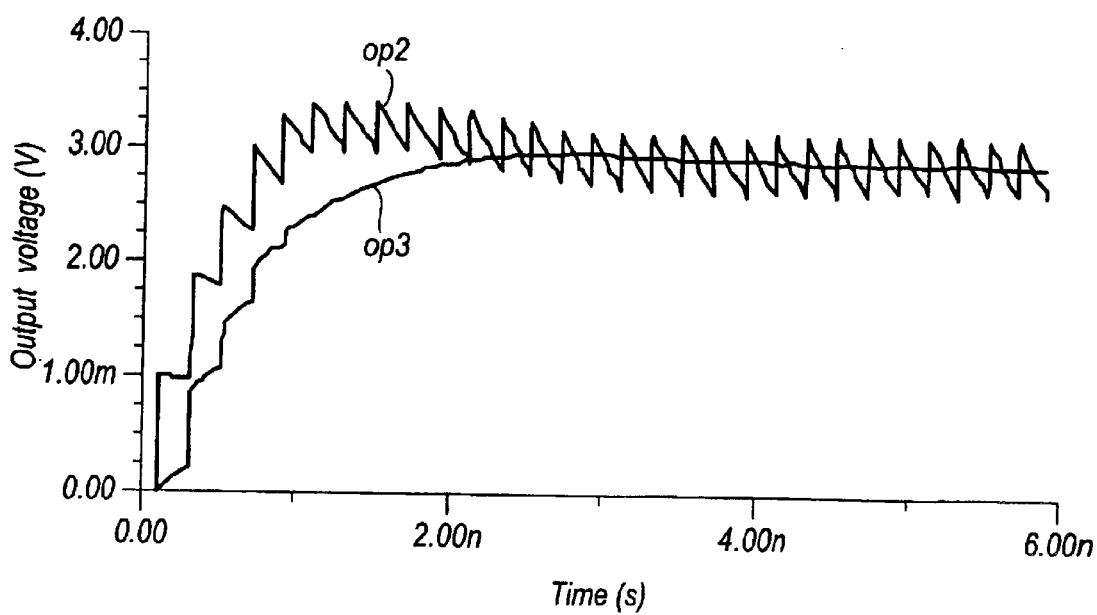

FIGS. 3 and 4 demonstrate by simulation the extreme frequency range limits of the AAJC shown in FIG. 2 when only the resistor R2 is varied. However, purely for the purpose of display of aquisition within a limited number of input waveform cycles, the time constant C4R1 has been appropriately chosen in each case. FIG. 5 shows the AAJC simulation operating of 5 GHz. In all cases the waveforms are for operation starting from initial switch on. The acquisition time is when the two waveforms of Op2 and Op3 intersect with no further missed intersections.

Figure 6:
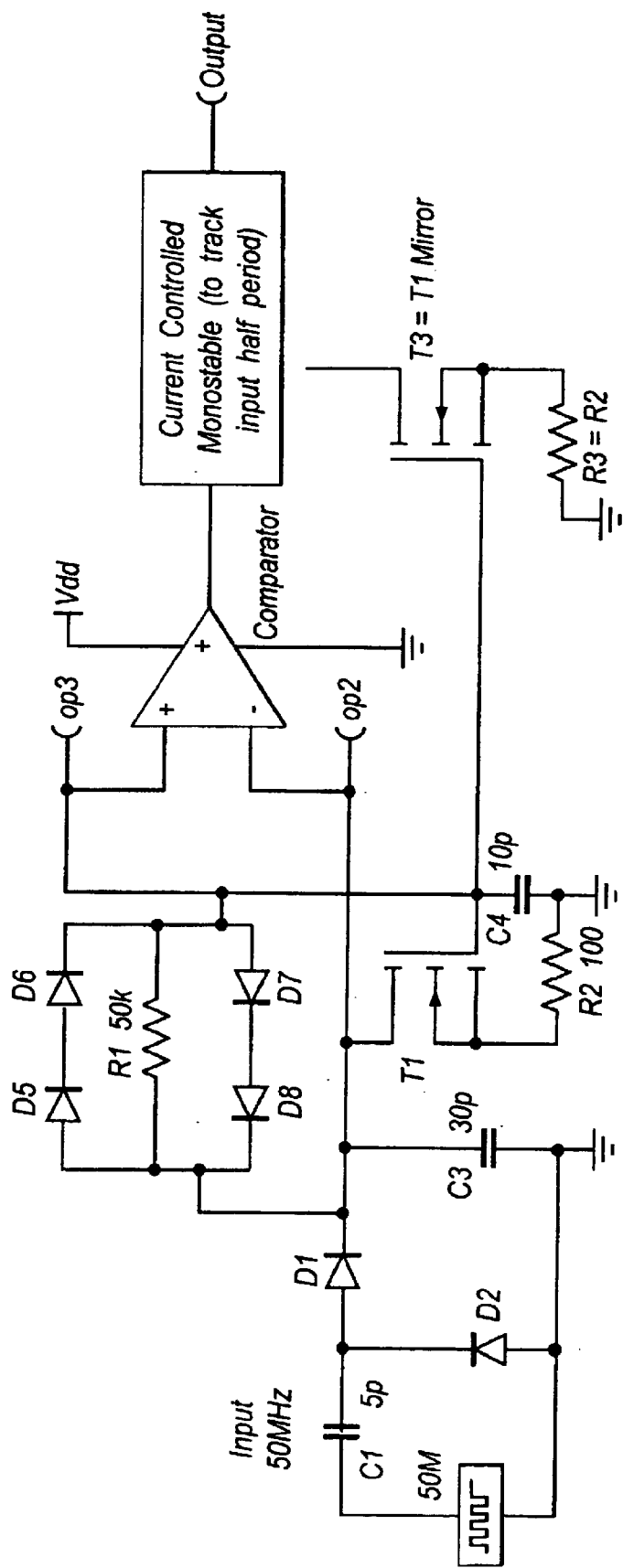
FIG. 6 shows an anti-jitter circuit according to the invention in which the pulse length of an output monostable circuit is controlled.

As an additional improvement, shown in FIG. 6, the mean dc output from the low pass filter (being a direct function of may be frequency) can be used directly or through a matched current mirror process to control the pulse length of an output monostable. In this way the overall circuit can be made self-adjusting in terms of maintaining a good output waveform mark space ratio over a wide frequency range. A circuit arrangement for this is regarded as existing state of the art.

All the power for the AAJC circuit is obtained from the input source. An approximate estimate for the power dissipated in the circuit is the product of the discharge current and the mean d.c. voltage. Given ideal components there are no other dissipative processes in the circuit. A safer limit allowing for other losses would be to take the product of the input voltage swing and the discharge current.

A typical AAJC would operate with a discharge current of less than 1 to 2 mA with a 5 volt input swing. In this example the input source would have to provide a maximum of 10 mW.

In addition it is advantageous if the source waveform rise and fall times are short. Times of less than about one tenth of an average period minimise potential amplitude to phase conversion of any noise appearing at the input.

The amplitude of the input waveform should be reasonably constant over the short term. However it is a feature of the circuit that it automatically adjusts for long term (low frequency) variations in the input amplitude.

Figure 7A:
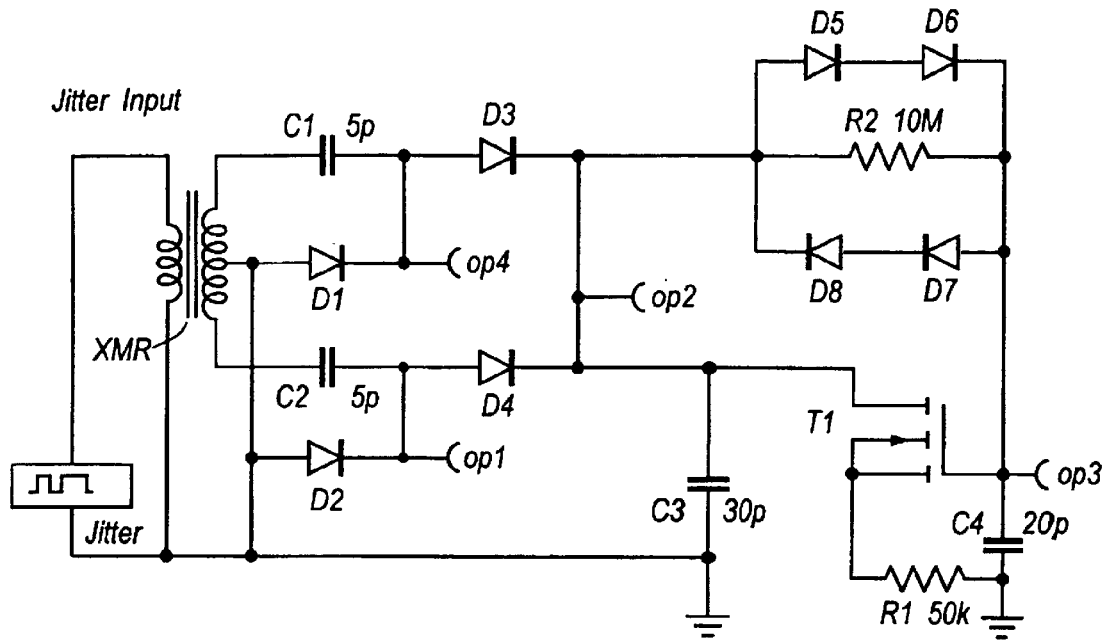
FIGS. 7(a) to 7(c) show an anti-jitter circuit according to the invention having a frequency doubling input.
Figure 7B:
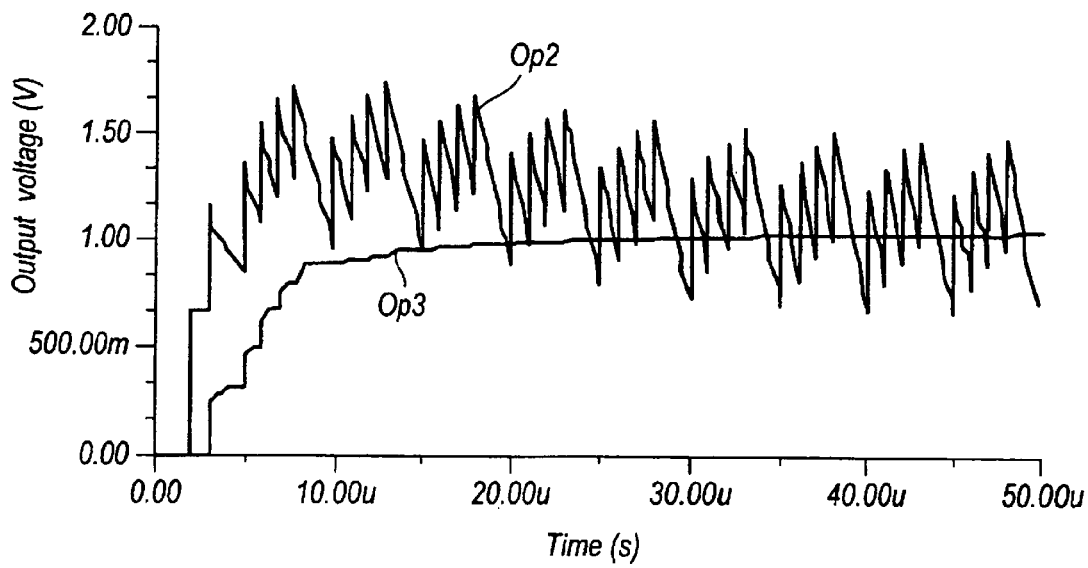
Figure 7C:
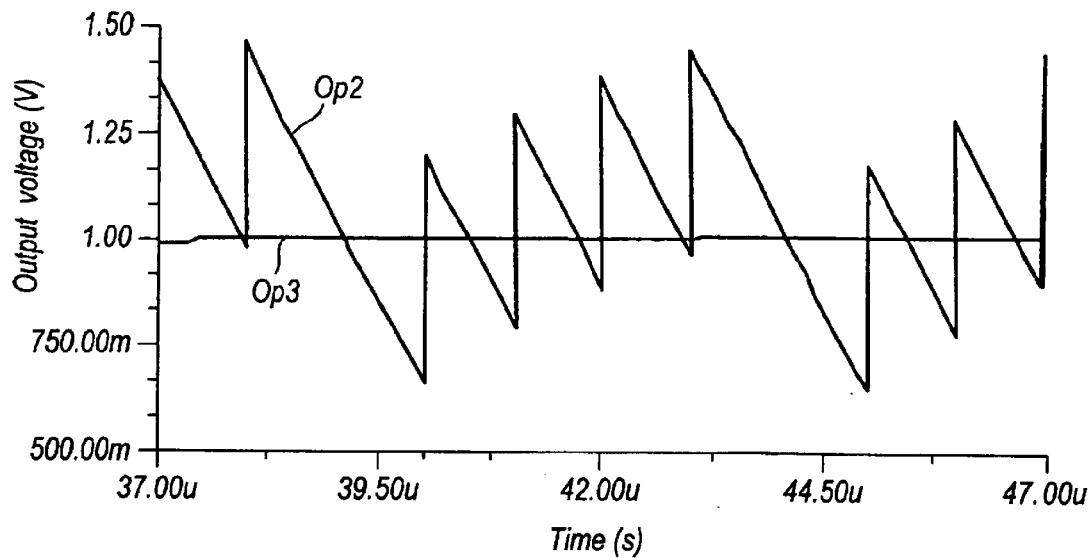
Figure 8A:
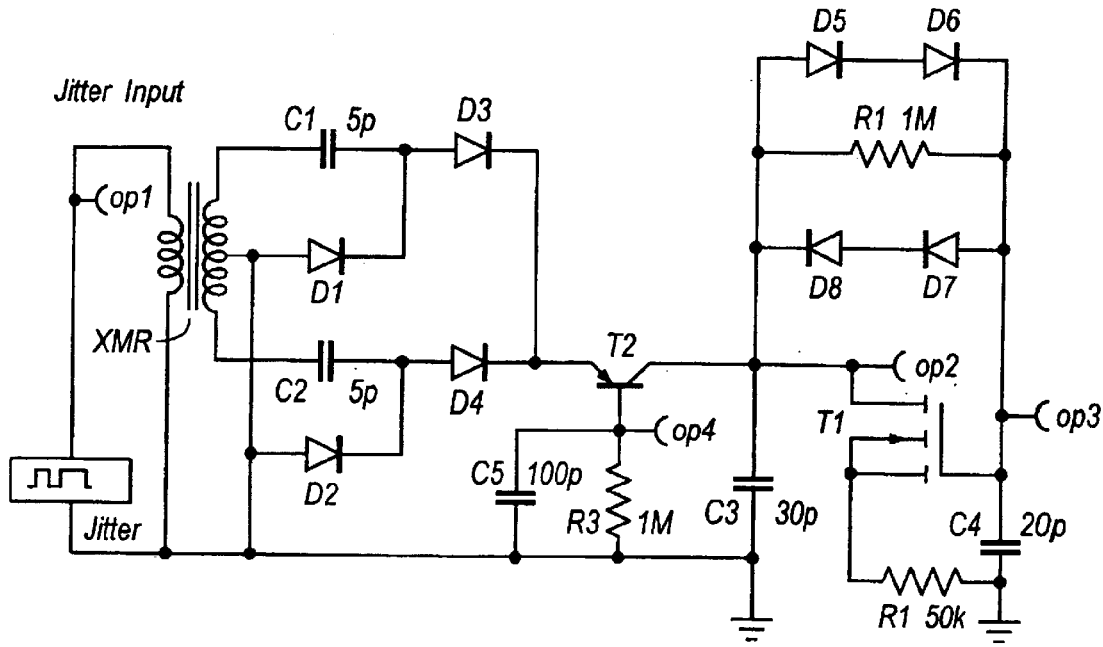
FIGS. 8(a) and 9(a) show anti-jitter circuits according to the invention including circuitry arranged to maintain the charge packets substantially constant.
Figure 8B:
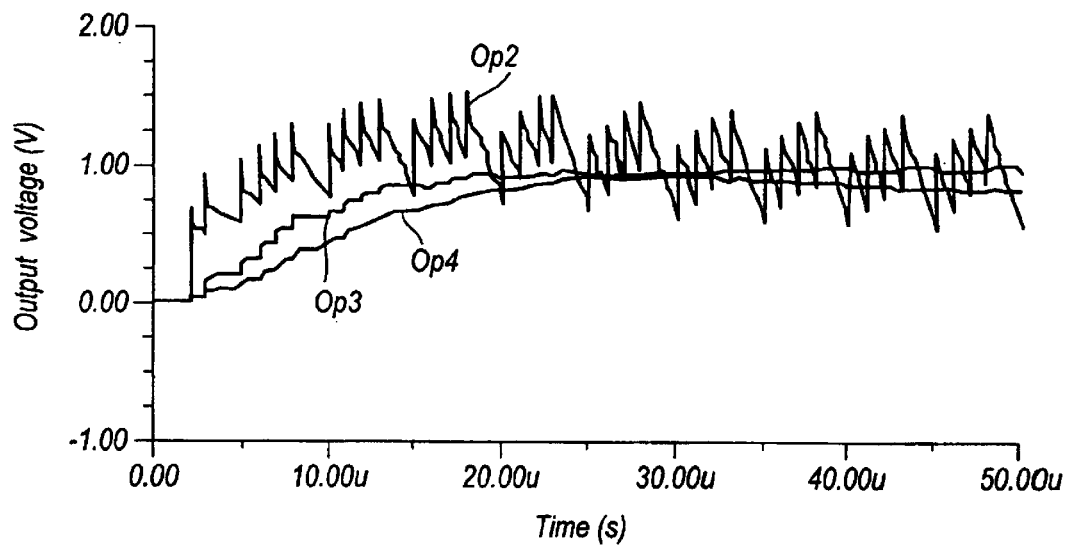
FIGS. 8(b) and 9(b) show the input waveforms Op2 and the mean d.c. levels Op3 overlaid.
Figure 8C:
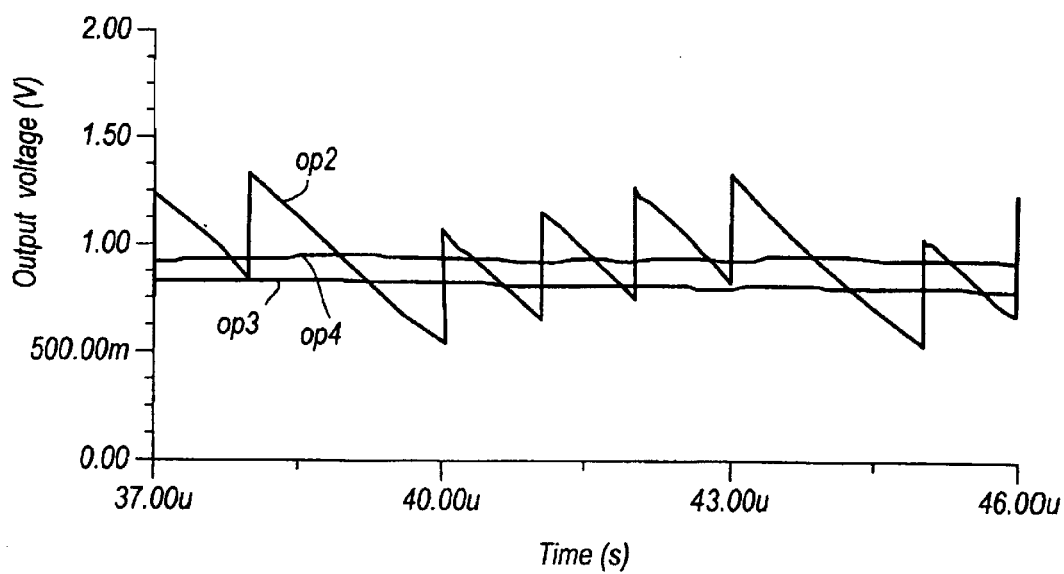
FIGS. 8(c) and 9(c) show an expanded detailed of the overlaid waveforms.
Figure 9A:
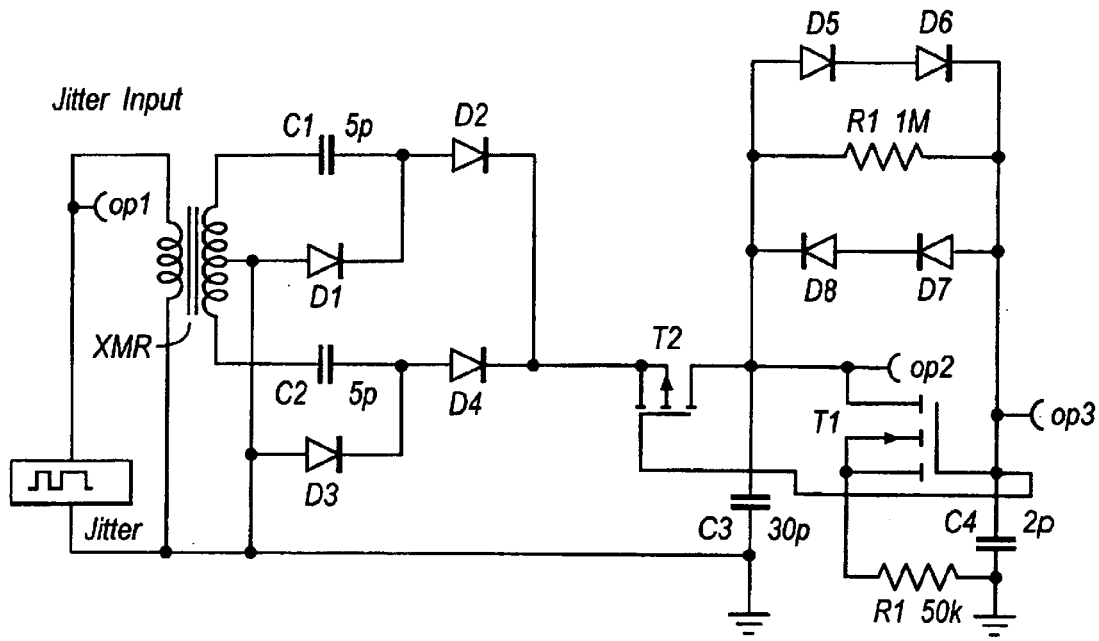
Figure 9B:
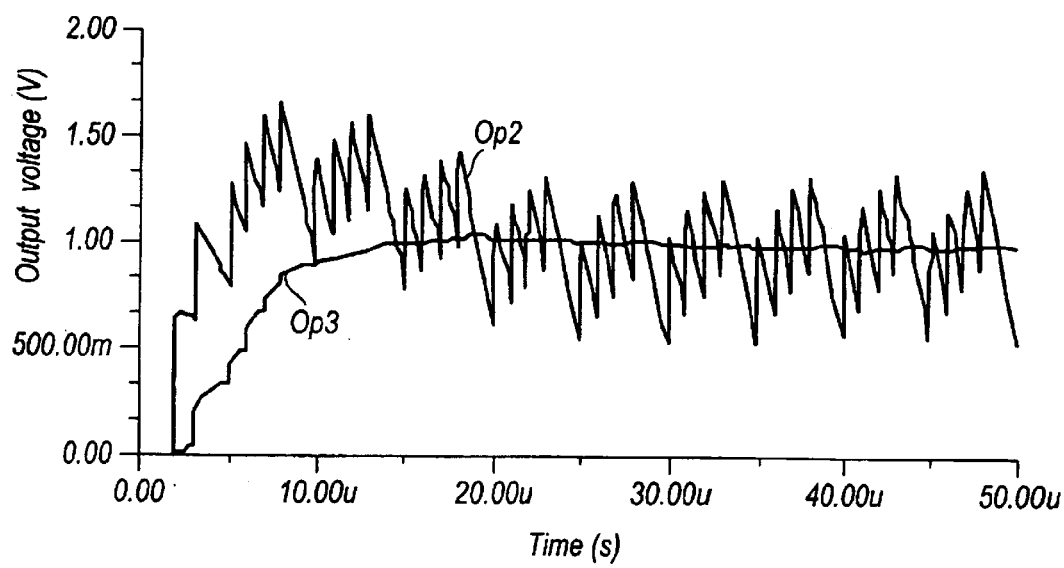
Figure 9C:
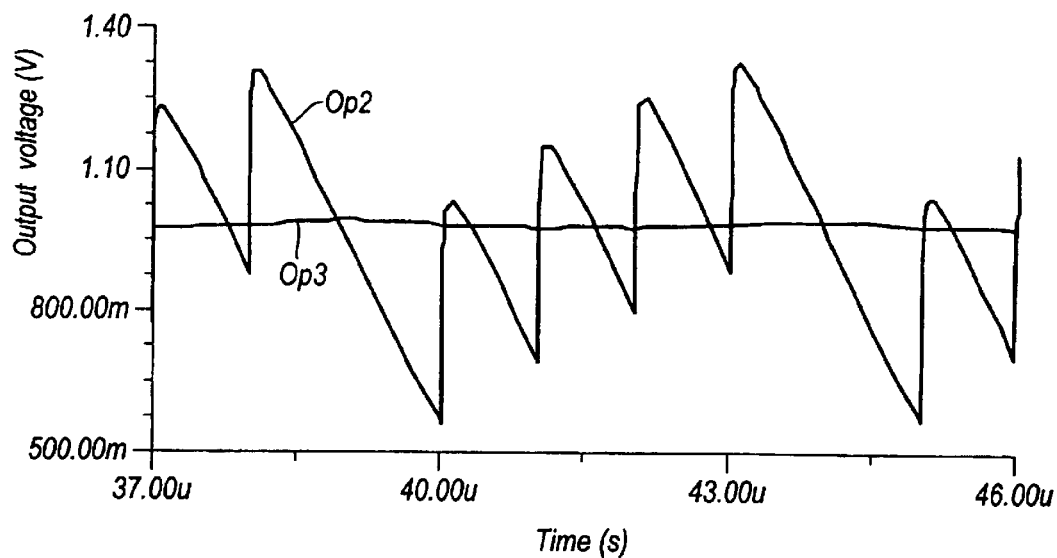

A frequency doubling circuit can be implemented in a very simple way with the AAJC as shown in FIGS. 7, 8 and 9. Here there are two input charge pumps C1, D1; C2, D2 which operate alternately on the rising and falling edges of the input waveform. The transformer XMR, is shown by way of example only and may be replaced by some transformerless push pull active circuit operating on the input signal. Advantages of frequency doubling and then dividing to obtain the final output are a further 6 dB of phase noise reduction and an equal output mark space ratio which is retained over the whole frequency range of operation.

A disadvantage of the simple diode charge pump as shown is that the value of the charge packets is approximately proportional to the voltage existing on the integrator storage capacitor at the start time of the charge packets. Thus to obtain the best jitter reduction it is advisable to keep the peak-to-peak sawtooth voltage as a small percentage as possible of the mean voltage. FIGS. 8 and 9 show a frequency doubling circuit where the charge packets are kept much more constant by the presence of transistor T2 and its base components C5 and R3 which perform an averaging function over a few input cycles. The transistor operates essentially in the grounded base mode while conveying charge. Since the base voltage stays constant over several input cycles any phase jumps causing the mean level of the sawtooth waveform to vary do not cause the size of the charge packets to vary. The input capacitors C1 and C2 are charged or discharged into constant voltage sinks. Obviously this technique also applies to the basic circuits as well where frequency doubling is not implemented.

FIG. 9 shows a more convenient arrangement if T2 is a FET. The time constant components C5 and R3 are no longer required because the gate of T2 is connected to the gate of T1.

Transistors T2 in FIG. 8 and FIG. 9 are the most likely devices to restrict the upper frequency operation of the circuit. Because the mobility of holes is less than for electrons it may be advantageous to exchange p-devices for n-devices (or pnp for npn) and vice versa and at the same time reverse the sense of the input diodes. It is likely in practice that this will result in somewhat higher maximum frequency of operation.

In the embodiments described with reference to FIGS. 2 to 9 the sawtooth waveform (Op2) and the mean d.c level (Op3) are supplied to respective inputs of a differential comparator.

It will be appreciated that a DC reference point in these circuits may conveniently be chosen to be at any RF ground point because points connected by low frequency capacitors or decoupling capacitors are effectively all at the same RF potential.

Therefore, the ground connection in the embodiments of FIGS. 2 to 9 could be replaced by a suitably decoupled low impedance voltage source connected to the gate of the FET (or the base of an equivalent bipolar transistor). This voltage source can be arranged to establish the correct switching level for the comparator, which then can be a simple single input comparator, such as a high impedance CMOS inverter (NOT gate) instead of the differential comparator used in the embodiments of FIGS. 2 to 9.

Figure 10:
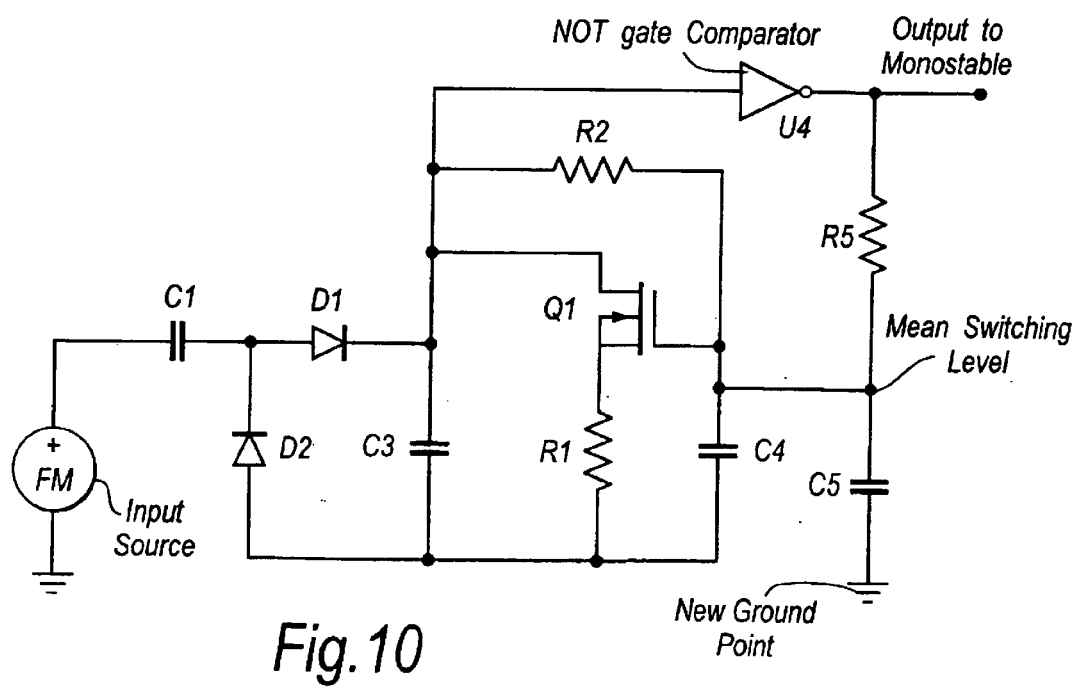
FIG. 10 shows a further embodiment of an anti-jitter circuit according to the present invention.

FIG. 10 shows a further embodiment of the invention in which inverted gate means in the form of a NOT gate U4 is used as a fast switching comparator. The switching level of the gate can vary appreciably with time and temperature; however, this can be controlled by provision of a further negative DC feedback path connected between the output of NOT gate U4 and the control input i.e. the gate of FET Q1. To this end, a simple, single RC low pass filter ($R_5,C_5$) provides sufficient filtering to establish the mean output level. In this way, the NOT gate U4 is automatically 'self-biased' to the correct switching level.

As in the embodiments of FIGS. 2 to 9, the input source V1 is connected to isolating capacitor C1 and to diodes D1,D2 which feed pulses to the integrator storage capacitor C3. FET Q1 discharges the capacitor C3 and the resultant sawtooth waveform is supplied to the comparator; that is, to the single input of the NOT gate U4.

The NOT gate U4 feeds the RC low pass filter R5,C5 which produces a mean DC voltage level on capacitor C5 and this voltage is supplied to the gate of FET Q1 as an offset reference voltage. As before, FET Q1 in combination with resistor R1 acts as a current drain and the voltage on capacitor C4 governs the voltage on resistor R1 and hence the constant current discharging capacitor C3 via resistor R1.

As before, R2 is a large value resistor which in combination with capacitors C3 and C4 establishes the sideband frequency below which the jitter suppression starts to degrade at a rate of 6 dB per octave. R2 could optionally have an even larger resistance value, with back-to-back diodes connected across the resistor (i.e. two diodes, one with each polarity in parallel with R2, as shown in FIG. 2a).

The time constant of the low pass filter R5,C5 should conveniently be chosen to give a sideband frequency for the further negative DC feedback path that is a little lower than that defined by R2,C3 and C4, thereby to ensure the lowest possible sideband frequency and the fastest possible settling time after switch-on.

In practice, packaged CMOS gates have input circuits providing protection against electrostatic discharge (ESSD). Such gates may have insufficiently high input impedance for use in an anti-jitter circuit of the kind described with reference to FIG. 10 due to a relatively high sideband frequency. In a CMOS IC, implementation of such protection circuitry is not needed on the chip and for packaged gates an additional FET or complementary FET pair may be used to provide simple high impedance input buffering.

Particularly advantageous aspects of the described exemplary embodiments include:

1. An input source having approximately constant amplitude. It is also desirable, but not essential, that the input waveform should have a risetime no longer than about one tenth of an average period of the input waveform. Circuit performance in practice is then found to be improved.

2. An input capacitor C1 (or pair of input capacitors C1 and C2) can be used to form an input charge packet of substantially constant charge value when switched at one terminal by the aforesaid input signal.

3. An integrator capacitor can be used that is charged by constant charge packets at the input frequency rate, and 4. permanently discharged by a controlled discharge current source or sink. The discharge device can be almost any transistor having a reasonably high output impedance for its drain or collector.

5. A low pass filter (typically a single section RC filter) may be connected to form a negative feedback path from the storage capacitor to the control input (gate or base) of the controlled current source.

6. The negative feedback connection causes a substantially constant mean d.c. level to exist on the storage capacitor. The feedback thus performs the function of d.c. removal so that the storage capacitor, considered as an integrator of the charge and discharge currents, is not affected by d.c. drift.

7. A differential comparator can be used with one input connected to, and responsive to the sawtooth waveform on, the storage capacitor and the other input connected to the mean d.c. level (at the output of the low pass filter).

8. A triggered output circuit as described in the aforementioned publication, can be connected to be triggered only by the low jitter output transition of the comparator. (The low jitter transition occurs on the slower of the two sawtooth waveform slopes).

9. Back to back speedup diodes (D5 to D8) can be connected to form a low impedance path between the input and output of the feedback low pass filter for the case when input phase jumps cause the integrator voltage to jump out of limits set by the number of diodes in series and the typical diodes offset voltages.

10. A frequency doubling input circuit may be provided in which two charge pumps operate alternately on the rising and falling edges of the input waveform and convey their charge packets via a common path to the storage capacitor.

11. (a). A common gate or common base transistor circuit may be connected in the path between the input capacitor(s) and the storage capacitor, so that better, constancy of charge packets in ensured.

(b). A time constant may also be connected to the base to ensure constancy of charge packet size in the short term fluctuations in input signal amplitude. Or the gate of T2 may be connected to the gate of T1.

12. The use of the low pass filter output voltage (which is known function of frequency) to keep the mark space ratio of an output monostable essentially constant for a wide range of input frequencies. A FET can alternatively be connected to the gate of T1 mirror the current of T1 to a current controlled output monostable to achieve the same objective.

What is claimed is:

1. An anti-jitter circuit for reducing time jitter in an input pulse train comprising:

an integrator charge storage means for storing charge, charging means for deriving from the input pulse train at least-one charge packet during each cycle of the input pulse train and for supplying the charge packets to the integrator charge storage means, discharging means for continuously discharging the integrator charge storage means, the charging means and the discharging means being operative to create on the integrator charge storage means a time varying voltage waveform, a low pass filter coupled to said integrator charge storage means for deriving a mean d.c. voltage level of said time varying voltage waveform, and means for comparing said time varying voltage waveform with said mean d.c. voltage level and deriving an output pulse train as a result of the comparison.

2. An anti-jitter circuit as claimed in claim 1 wherein said discharging means comprises a discharge device having a control input and said low pass filter defines a negative feedback path between the control input and an output of the integrator charge storage means whereby to maintain said mean d.c. voltage level substantially constant.

3. An anti-jitter circuit as claimed in claim 2 wherein said discharge device is a current source or a current sink.

4. An anti-jitter circuit as claimed in claim 3 wherein said discharge device is a transistor.

5. An anti-jitter circuit as claimed in claim 2 wherein said mean d.c. voltage level is generated at an output of said negative feedback path and said means for comparing comprises a comparator having a first input coupled to the integrator charge storage means and a second input coupled to said output of the negative feedback path.

6. An anti-jitter circuit as claimed in claim 2 further including a monostable circuit connected to the output of said means for comparing.

7. An anti-jitter circuit as claimed in claim 6 wherein said mean d.c. voltage level is used to control the pulse length of pulses output by the monostable circuit.

8. An anti-jitter circuit as claimed in claim 7 wherein the monostable circuit is a current-controlled monostable circuit and has a control input coupled to an output of said negative feedback path by a current mirror matched to said discharge device.

9. An anti-jitter circuit as claimed in claim 8 wherein said discharge device and said current mirror are matched transistors.

10. An anti-jitter circuit as claimed in claim 6 wherein said monostable circuit is triggered whenever a discharge part of the time-varying voltage waveform crosses the mean d.c. voltage level.

11. An anti-jitter circuit as claimed in claim 2 wherein said means for comparing comprises inverted gate means having an input coupled to the integrator charge storage means and an output, and including means defining a further negative feedback path between said output of said inverted gate means and said discharging means whereby to establish said mean d.c. voltage level as a switching level of said inverted gate means.

12. An anti-jitter circuit as claimed in claim 11 wherein said further negative feedback path is connected between said output of said inverted gate means and said control input of said discharge device.

13. An anti-jitter circuit as claimed in claim 12 wherein said further negative feedback path comprises a further low pass filter.

14. An anti-jitter circuit as claimed in claim 13 wherein said further low pass filter comprises the combination of a resistor and a capacitor.

15. An anti-jitter circuit as claimed in claim 11 wherein said further negative feedback path comprises a further low pass filter.

16. An anti-jitter circuit as claimed in claim 15 wherein said further low pass filter comprises the combination of a resistor and a capacitor.

17. An anti-jitter circuit as claimed in claim 2 wherein said means for comparing comprises inverted gate means having an input coupled to the integrator charge storage means and an output, and including a voltage source coupled to the discharging means whereby to establish said mean d.c. voltage level as a switching level of said inverted gate means.

18. An anti-jitter circuit as claimed in claim 17 wherein said voltage source is connected between said output of said inverted gate means and said control input of said discharge device.

19. An anti-jitter circuit as claimed in claim 2 including means providing a low impedance path between the input and the output of the negative feedback path.

20. An anti-jitter circuit as claimed in claim 19 wherein said low impedance path is formed by diodes connected back-to-back.

21. An anti-jitter circuit as claimed in claim 1 wherein the low pass filter comprises the combination of a resistor and a capacitor.

22. An anti-jitter circuit as claimed in claim 1 wherein said discharging means comprising a first charging means and a second charging means for deriving the charge packets respectively from the rising and falling edges of the input pulse train, said first and second charging mean being effective as a frequency doubling means.

23. An anti-jitter circuit as claim in claim 1 further including means for maintaining the charge value of the charge packets substantially constant.

24. An anti-jitter circuit as claimed in claim 23 wherein said means for maintaining comprises a further transistor coupled between said charging means and said integrator charge storage means.

25. An anti-jitter circuit as claimed in claim 24 wherein said further transistor is arranged to operate in grounded base mode.

26. An anti-jitter circuit as claimed in claim 25 including averaging means connected to the base of the further transistor.

27. An anti-jitter circuit as claimed in claim 24 wherein said discharging means includes a first field effect transistor operative as a discharge device and said further transistor is a second field effective transistor, and the gate of the first field effect transistor is connected to the gate of the second field effect transistor.

28. An anti-jitter circuit as claimed in claim 1 wherein said charging means is a charge pump.

* * * * *

UNITED STATES PATENT AND TRADEMARK OFFICE
CERTIFICATE OF CORRECTION

PATENT NO. : 6,791,393 B1
DATED : September 14, 2004
INVENTOR(S) : Underhill

It is certified that error appears in the above-identified patent and that said Letters Patent is hereby corrected as shown below:

Column 1,
Line 2, please insert
-- FIELD OF THE INVENTION
This invention relates to anti-jitter circuits (AJC) --.

Column 6, line 55 - Column 8, line 56,
Replace the claims in their entirety with the following:

1. An anti-jitter circuit for reducing time jitter in an input pulse train comprising:

an integrator charge storage means for storing charge, charging means for deriving from the input pulse train at least one charge packet during each cycle of the input pulse train and for supplying the charge packets to the integrator charge storage means, discharging means for continuously discharging the integrator charge storage means, the charging means and the discharging means being operative to create on the integrator charge storage means a time varying voltage, a low pass filter coupled to said integrator charge storage means for deriving a mean d.c. voltage of said time varying voltage, and means for comparing said time varying voltage with said mean d.c. voltage and deriving an output pulse train as a result of the comparison.

UNITED STATES PATENT AND TRADEMARK OFFICE
CERTIFICATE OF CORRECTION

PATENT NO.    : 6,791,393 B1
DATED         : September 14, 2004
INVENTOR(S)   : Underhill It is certified that error appears in the above-identified patent and that said Letters Patent is hereby corrected as shown below:

<u>Column 6, line 55 - Column 8, line 56 (cont'd),</u>

2. An anti-jitter circuit as claimed in claim 1 wherein said discharging means comprises a discharge device having a control input and said low pass filter defines a negative feedback path between the control input and an output of the integrator charge storage means whereby to maintain said mean d.c. voltage substantially constant.

3. An anti-jitter circuit as claimed in claim 2 wherein said discharge device is a current source or a current sink.

4. An anti-jitter circuit as claimed in claim 3 wherein said discharge device is a transistor.

5. An anti-jitter circuit as claimed in claim 2 wherein said mean d.c. voltage is generated at an output of said negative feedback path and said means for comparing comprises a comparator having a first input coupled to the integrator charge storage means and a second input coupled to said output of the negative feedback path.

UNITED STATES PATENT AND TRADEMARK OFFICE
CERTIFICATE OF CORRECTION

PATENT NO. : 6,791,393 B1
DATED : September 14, 2004
INVENTOR(S) : Underhill

It is certified that error appears in the above-identified patent and that said Letters Patent is hereby corrected as shown below:

Column 6, line 55 - Column 8, line 56 (cont'd),

6. An anti-jitter circuit as claimed in claim 2 further including a monostable circuit connected to the output of said means for comparing.

7. An anti-jitter circuit as claimed in claim 6 wherein said d.c. voltage is used to control the pulse length of pulses output by the monostable circuit.

8. An anti-jitter circuit as claimed in claim 7 wherein the monostable circuit is a current-controlled monostable circuit and has a control input coupled to an output of said negative feedback path by a current mirror matched to said discharge device.

9. An anti-jitter circuit as claimed in claim 8 wherein said discharge device and said current mirror are matched transistors.

10. An anti-jitter circuit as claimed in claim 6 wherein said monostable circuit is triggered whenever a discharge part of the time-varying voltage crosses the mean d.c. voltage.

11. An anti-jitter circuit as claimed in claim 2 including means providing a low impedance path between the input and the output of the negative feedback path.

UNITED STATES PATENT AND TRADEMARK OFFICE
CERTIFICATE OF CORRECTION

PATENT NO. : 6,791,393 B1
DATED : September 14, 2004
INVENTOR(S) : Underhill

It is certified that error appears in the above-identified patent and that said Letters Patent is hereby corrected as shown below:

Column 6, line 55 - Column 8, line 56 (cont'd),

12. An anti-jitter circuit as claimed in claim 11 wherein said low impedance path is formed by diodes connected back-to-back.

13. An anti-jitter circuit as claimed in claim 1 wherein the low pass filter comprises the combination of a resistor and a capacitor.

14. An anti-jitter circuit as claimed in claim 1, wherein said charging means comprises a first charging means and a second charging means for deriving the charge packets respectively from the rising and falling edges of the input pulse train, said first and second charging means being effective as a frequency doubling means.

15. An anti-jitter circuit as claim in claim 1 further including means for maintaining the charge value of the charge packets substantially constant.

16. An anti-jitter circuit as claimed in claim 15 wherein said means for maintaining comprises a further transistor coupled between said charging means and said integrator charge storage means.

UNITED STATES PATENT AND TRADEMARK OFFICE
CERTIFICATE OF CORRECTION

PATENT NO. : 6,791,393 B1
DATED : September 14, 2004
INVENTOR(S) : Underhill

It is certified that error appears in the above-identified patent and that said Letters Patent is hereby corrected as shown below:

Column 6, line 55 - Column 8, line 56 (cont'd),

17. An anti-jitter circuit as claimed in claim 16 wherein said further transistor is arranged to operate in grounded base mode.

18. An anti-jitter circuit as claimed in claim 17 including averaging means connected to the base of the further transistor.

19. An anti-jitter circuit as claimed in claim 16 wherein said discharging means includes a first field effect transistor operative as a discharge device and said further transistor is a second field effective transistor, and the gate of the first field effect transistor is connected to the gate of the second field effect transistor.

20. An anti-jitter circuit as claimed in claim 1 wherein said charging means is a charge pump.

21. An anti-jitter circuit for reducing time jitter in an input pulse train comprising:
    an integrator charge storage means for storing charge,
    charging means for deriving from the input pulse train at least one charge

UNITED STATES PATENT AND TRADEMARK OFFICE
CERTIFICATE OF CORRECTION

PATENT NO. : 6,791,393 B1
DATED : September 14, 2004
INVENTOR(S) : Underhill

It is certified that error appears in the above-identified patent and that said Letters Patent is hereby corrected as shown below:

Column 6, line 55 - Column 8, line 56 (cont'd), packet during each cycle of the input pulse train and for supplying the charge packets to the integrator charge storage means, discharging means for continuously discharging the integrator charge storage means, said discharging means comprising a discharge device having a control input, the charging means and the discharging means being operative to create on the integrator charge storage means a time varying voltage, and means for comparing said time varying voltage with a mean d.c. voltage and deriving an output pulse train as a result of the comparison, said means for comparing comprising a low pass filter coupled to said integrator charge storage means for deriving said mean d.c. voltage of said time varying voltage, said low pass filter comprising a resistor and a capacitor connected in series across said integrator charge storage means, said low pass filter defining a negative feedback path between the control input and an output of the integrator charge storage means whereby to maintain said mean d.c. voltage substantially constant, aid means for comparing further comprising inverted gate means having an input coupled to the integrator charge storage means and an output, and including means defining a further negative feedback path between said output of said inverted gate means and said discharging means whereby to establish said mean d.c. voltage as a switching level of said inverted gate means.

UNITED STATES PATENT AND TRADEMARK OFFICE
CERTIFICATE OF CORRECTION

PATENT NO. : 6,791,393 B1
DATED : September 14, 2004
INVENTOR(S) : Underhill

It is certified that error appears in the above-identified patent and that said Letters Patent is hereby corrected as shown below:

<u>Column 6, line 55 - Column 8, line 56 (cont'd),</u>

22. An anti-jitter circuit as claimed in claim 21 wherein said further negative feedback path is connected between said output of said inverted gate means and said control input of said discharge device.

23. An anti-jitter circuit as claimed in claim 22 wherein said further negative feedback path comprises a further low pass filter.

24. An anti-jitter circuit as claimed in claim 23 wherein said further low pass filter comprises the combination of a resistor and a capacitor.

25. An anti-jitter circuit as claimed in claim 21 wherein said further negative feedback path comprises a further low pass filter.

26. An anti-jitter circuit as claimed in claim 25 wherein said further low pass filter comprises the combination of a resistor and a capacitor.

UNITED STATES PATENT AND TRADEMARK OFFICE
CERTIFICATE OF CORRECTION

PATENT NO. : 6,791,393 B1
DATED : September 14, 2004
INVENTOR(S) : Underhill

It is certified that error appears in the above-identified patent and that said Letters Patent is hereby corrected as shown below:

Column 6, line 55 - Column 8, line 56 (cont'd),

27. An anti-jitter circuit for reducing time jitter in an input pulse train comprising:

an integrator charge storage means for storing charge, charging means for deriving from the input pulse train at least one charge packet during each cycle of the input pulse train and for supplying the charge packets to the integrator charge storage means, discharging means for continuously discharging the integrator charge storage means, said discharging means comprising a discharge device having a control input, the charging means and the discharging means being operative to create on the integrator charge storage means a time varying voltage, and means for comparing said time varying voltage with a mean d.c. voltage and deriving an output pulse train as a result of the comparison, said means for comparing comprising a low pass filter coupled to said integrator charge storage means for deriving said mean d.c. voltage of said time varying voltage, said low pass filter comprising a resistor and a capacitor connected in series across said integrator charge storage means, said low pass filter defining a negative feedback path between the control input and an output of the integrator charge storage means whereby to maintain said mean d.c. voltage substantially constant, said means for comparing further comprising, inverted gate means having an input coupled to the integrator charge storage means and an output, and including a voltage source coupled to the discharging means whereby to establish said mean d.c. voltage as a switching level of said inverted gate means.

UNITED STATES PATENT AND TRADEMARK OFFICE
CERTIFICATE OF CORRECTION

PATENT NO. : 6,791,393 B1
DATED : September 14, 2004
INVENTOR(S) : Underhill

It is certified that error appears in the above-identified patent and that said Letters Patent is hereby corrected as shown below:

Column 6, line 55 - Column 8, line 56 (cont'd),

28. An anti-jitter circuit as claimed in claim 27 wherein said voltage source is connected between said output of said inverted gate means and said control input of said discharge device.

Signed and Sealed this

Twenty-third Day of August, 2005

JON W. DUDAS
*Director of the United States Patent and Trademark Office*